United States Patent
Onishi et al.

(10) Patent No.: US 6,518,729 B2
(45) Date of Patent: Feb. 11, 2003

(54) SECONDARY BATTERY PROTECTION CIRCUIT CAPABLE OF REDUCING TIME FOR FUNCTIONAL TEST

(75) Inventors: Yoshitaka Onishi, Atsugi (JP); Kenichi Miki, Atsugi (JP); Yukihiro Terada, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 10/055,987

(22) Filed: Jan. 24, 2002

(65) Prior Publication Data

US 2002/0145406 A1 Oct. 10, 2002

(30) Foreign Application Priority Data

Feb. 6, 2001 (JP) ........................... 2001-029655

(51) Int. Cl.[7] .................................. H01M 10/46
(52) U.S. Cl. ............................ 320/134; 320/136
(58) Field of Search ............................ 320/127, 128, 320/133, 134, 135, 136, 137

(56) References Cited

U.S. PATENT DOCUMENTS 5,547,775 A * 8/1996 Eguchi et al.
5,742,148 A * 4/1998 Sudo et al.
6,060,863 A * 5/2000 Sakurai et al.
6,316,915 B1 * 11/2001 Fujiwara et al.
2002/0121880 A1 * 9/2002 Yamanaka et al.

FOREIGN PATENT DOCUMENTS

| JP | 9-43320 A | 2/1977 |
| JP | 9-257841 A | 10/1997 |
| JP | 2001-169477 A | 6/2001 |

* cited by examiner

*Primary Examiner*—Edward H. Tso
(74) *Attorney, Agent, or Firm*—Frishauf, Holtz, Goodman & Chick, P.C.

(57) ABSTRACT

A secondary battery protection circuit detects at least one of an over-discharge state, an over-charge state, and an over-current state of a secondary battery and performs an operation in accordance with the detected state. The secondary battery protection circuit comprises a blind time setting circuit constituted by an IC for setting a blind time in accordance with the detected state. The blind time setting circuit has a switching circuit for setting a blind time for a functional test that is shorter than a preset blind time.

6 Claims, 6 Drawing Sheets

| STATE | DELAY TIME |
|---|---|
| OVER-CURRENT | T-FF5 OUTPUT |
| OVER-DISCHARGE | T-FF9 OUTPUT |
| OVER-CHARGE | T-FF12 OUTPUT |

SECONDARY BATTERY PROTECTION CIRCUIT CAPABLE OF REDUCING TIME FOR FUNCTIONAL TEST

BACKGROUND OF THE INVENTION

The present invention relates to a secondary battery protection circuit for protecting a rechargeable secondary battery. The secondary battery protection circuit according to the present invention is used in a secondary battery unit having a secondary battery such as a lithium ion battery. It detects an over-charge state, over-discharge state, over-current state and the like of the secondary battery and performs a protecting operation in accordance with each of the states to protect the secondary battery.

There are various types of secondary batteries including nickel-cadmium batteries, nickel-hydrogen batteries, and lithium ion batteries. In order to charge the secondary battery, it is necessary to use a charger suitable for the type of the battery. Among the various types of secondary batteries, lithium ion batteries are vulnerable to over-charge and over-discharge. Therefore, it is essential that a secondary battery protection circuit of a battery unit having a lithium ion battery has a detection device for detecting an over-charge state and an over-discharge state of the lithium ion battery. Further, the secondary battery protection circuit must have a detection device for detecting an over-current state.

With respect to over-charge, when the lithium ion battery is charged with the charger, the battery voltage continues rising even in a full-charge state. When it enters the over-charge state, the battery can be broken due to an increase of the internal pressure of the battery, and shorting can occur between the electrodes because of deposition of lithium metal. For this reason, the lithium ion battery is charged at a rated current and a rated voltage. Further, a control voltage for charging at the rated voltage should not exceed the rating of the lithium ion battery. However, when the battery is charged with a charger for a secondary battery of a different type by mistake, the battery voltage may exceed the rated voltage of the lithium ion battery. An over-charge protecting function is a function of blocking the charging current such that the battery voltage will not exceed the maximum rating of the lithium ion battery in such a case.

With respect to over-discharge, the performance of a nickel-cadmium battery or nickel-hydrogen battery deteriorates unless it is charged after it is used until the battery capacity becomes zero. In other words, nickel-cadmium batteries and nickel-hydrogen batteries exhibit a so-called memory effect that is deterioration of performance attributable to insufficient discharging and charging repeated during the use of the batteries. On the contrary, lithium ion batteries are idealistic as secondary batteries in that they do not exhibit the memory effect. However, constituent substances of the lithium ion battery can deteriorate to reduce the life of the battery when the battery voltage falls below a predetermined value as a result of over-discharge. An over-discharge protecting function is a function of blocking the discharging current when the battery voltage falls below the predetermined value.

With respect to an over-current, a great current can flow when a positive terminal and a negative terminal of the lithium ion battery is erroneously shorted by some metal during storage or transportation of the lithium ion battery or when shorting occurs as a result of a failure of an apparatus to which the battery is connected. An over-current protecting function is a function of blocking the discharging current by detecting the value of the current with a secondary battery protection circuit.

The protecting operation of any of the above-described protecting functions is activated by detecting a voltage or current. Such a voltage or current may fluctuate for a very short time. In such a case, there is no need for the above-described protecting operation even in the case of a fluctuation with a great value. In order to achieve this, the secondary battery protection circuit includes a blind time setting circuit. The blind time setting circuit prevents, for example, the execution of the over-current protecting operation for a predetermined time or a blind time even when an over-current is detected. This applies to the over-charge and over-discharge operations.

However, as will be described in detail later, conventional secondary battery protection circuits have the following problems.

When the assembly of the secondary battery protection circuit is completed, a functional test is carried out on the same. For example, the function of an over-current detecting circuit is tested by repeatedly checking whether a protecting operation against the over-current properly takes place by applying an over-current actually. In this case, there is no need for the blind time, because the function of the over-current detecting circuit can be tested by only checking whether the protecting operation properly takes place against the over-current. However, since the blind time setting circuit also functions during the functional test, it is not possible to know whether the protecting operation properly takes place against the over-current unless the blind time set for the over-current passes. In addition, the above-described functional test must be carried out not only for the over-current but also for the over-charge and over-discharge. As a result, the secondary battery protection circuit as a whole has a waiting time attributable to the blind time that can not be ignored, which necessitates a long time to carry out the functional test.

SUMMARY OF THE INVENTION

It is therefore an object of the present invention to provide a secondary battery protection circuit having a blind time setting circuit in which a blind time can be reduced during a functional test.

It is a specific object of the present invention to provide a secondary battery protection circuit having a blind time setting circuit in which a blind time can be reduced even when the blind time setting circuit is manufactured by incorporating the same in an IC.

A secondary battery protection circuit according to the present invention detects at least one of an over-discharge state, over-charge state, and over-current state of a secondary battery and performs an operation in accordance with the detected state. The secondary battery protection circuit has a blind time setting circuit constituted by an IC for setting a blind time in accordance with the detected state. In an aspect of the present invention, the blind time setting circuit has a switching circuit for setting a blind time for a functional test that is shorter than a preset blind time.

Furthermore, according to the present invention, it is also provided a secondary battery unit which is provided with the above mentioned secondary battery protection circuit.

DETAILED DESCRIPTION OF PREFERRED EMBODIMENT

Figure 1:
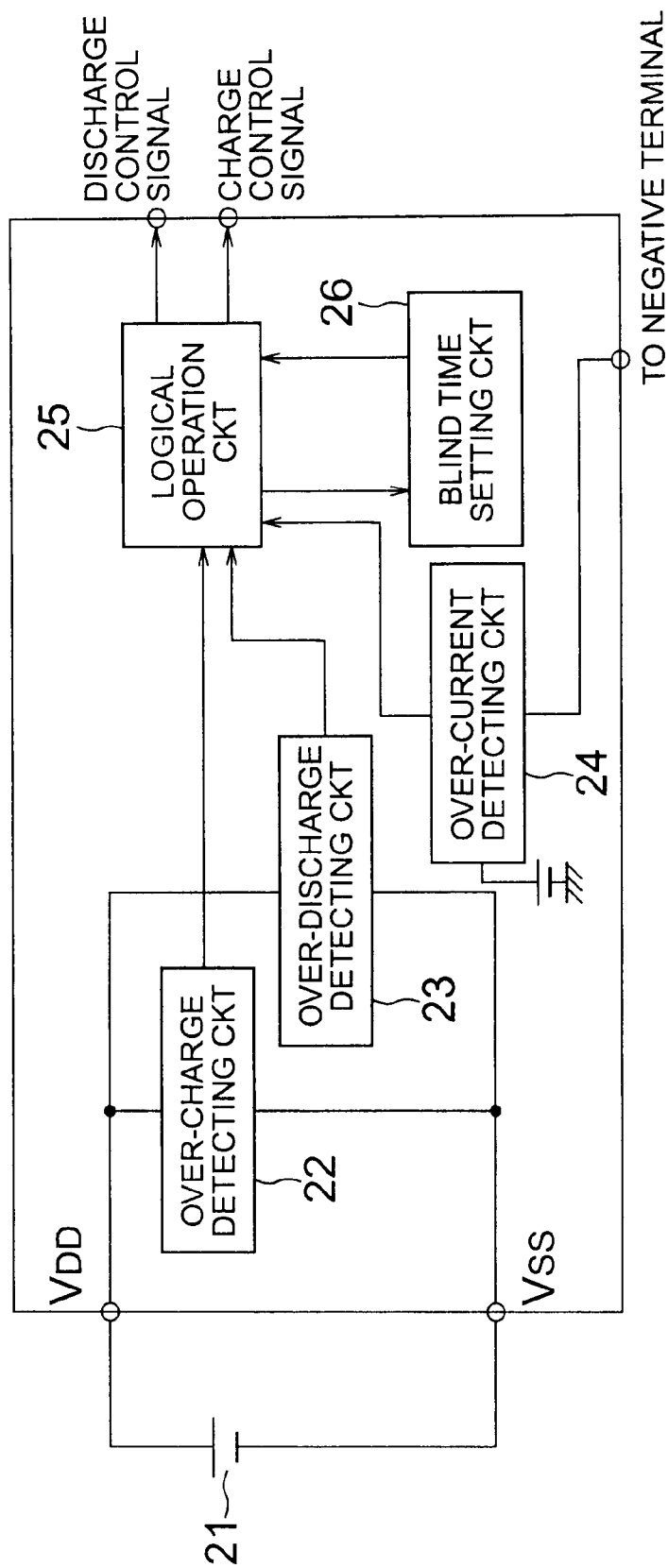
FIG. 1 is a block diagram showing an example of a secondary battery protection circuit.

For easier understanding of the present invention, a description will now be made with reference to FIG. 1 on a secondary battery protection circuit having the various functions described above. In FIG. 1, an over-charge detecting circuit 22 and an over-discharge detecting circuit 23 are connected in parallel to a lithium ion battery 21. The over-charge detecting circuit 22 outputs an over-charge detection signal when it detects an over-charge state, and the over-discharge detecting circuit 23 outputs an over-discharge detection signal when it detects an over-discharge state. An over-current detecting circuit 24 is connected to a power supply line extending to a load (not shown) to detect an over-current state. The over-current detecting circuit 24 outputs an over-current detection signal when it detects an over-current. The over-charge detection signal, over-discharge detection signal, and over-current detection signal are maintained for the duration of the over-charge, over-discharge, and over-current states respectively and are input to a logical operation circuit 25.

When the logical operation circuit 25 receives the input of the over-charge detection signal, over-discharge detection signal, and over-current detection signal, it supplies a signal associated with each of the states to a blind time setting circuit 26. When the blind time setting circuit 26 receives a signal associated with the detection of the over-current from the logical operation circuit 25 for example, it outputs an over-current instruction signal to the logical operation circuit 25 after a blind time passes, the blind time being preset in association with the detection of the over-current. Upon reception of the over-current instruction signal, the logical operation circuit 25 outputs a discharge control signal for blocking a discharging current. When the blind time setting circuit 26 receives a signal associated with the detection of the over-charge from the logical operation circuit 25 for example, it outputs an over-charge instruction signal to the logical operation circuit 25 after a blind time passes, the blind time being preset in association with the detection of the over-charge. Upon reception of the over-charge instruction signal, the logical operation circuit 25 outputs a charge control signal for blocking a charging current. When the blind time setting circuit 26 receives a signal associated with the detection of the over-discharge from the logical operation circuit 25, it outputs an over-discharge instruction signal to the logical operation circuit 25 after a blind time passes, the blind time being preset in association with the detection of the over-discharge. Upon reception of the over-discharge instruction signal, the logical operation circuit 25 outputs the discharge control signal for blocking the discharging current.

While FIG. 1 shows a case in which a single lithium ion battery 21 is used, when a plurality of lithium ion batteries are connected in series, an over-charge detecting circuit, an over-discharge detecting circuit, and an over-current detecting circuit are provided for each of them. For example, over-charge detecting circuits, over-discharge detecting circuits, and over-current detecting circuits are disclosed in Japanese Patent Laid-Open No. 43320/1997 and Japanese Patent Laid-Open No. 257841/1997. The blind time setting circuit is disclosed, for example, in Japanese Patent Laid-Open No. 169477/2001.

Figure 2:
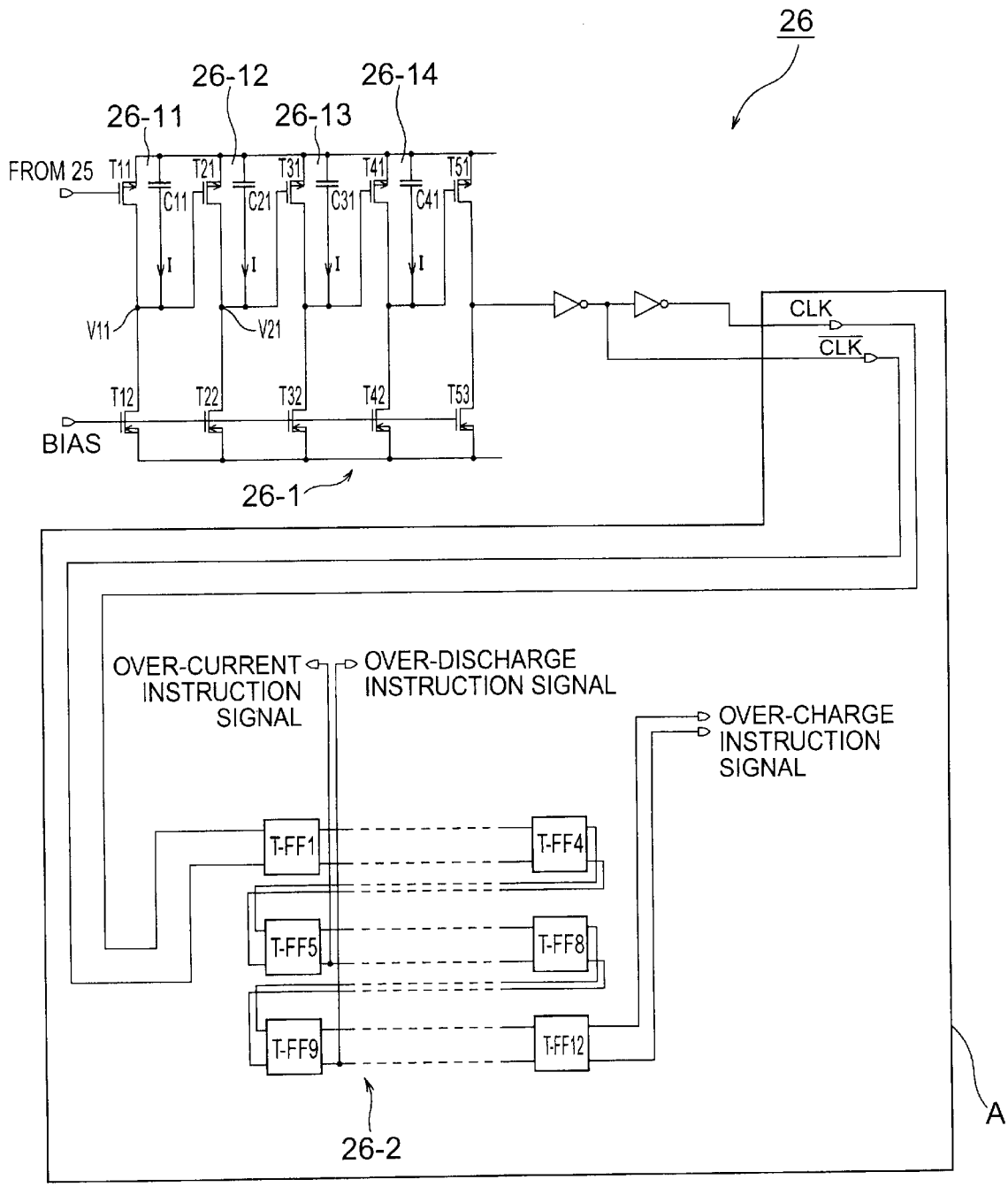
FIG. 2 is a circuit diagram showing a configuration of a conventional blind time setting circuit.

FIG. 2 shows an example of a circuit that is the blind time setting circuit 26 as described above provided in the form of an IC (Integrated Circuit). The blind time setting circuit 26 is comprised of a clock generation circuit 26-1 and a flip-flop (hereinafter abbreviated as "FF") circuit 26-2. The clock generation circuit 26-1 is a circuit for generating clocks CLK and $\overline{CLK}$ for the FF circuit 26-2. The clock $\overline{CLK}$ is a signal obtained by inverting the clock CLK. An output $\overline{Q}$ of the FF circuit is also a signal obtained by inverting an output Q of the FF circuit. The FF circuit 26-2 is comprised of twelve stages of dividing toggle (hereinafter abbreviated as "T") T-FF1 through T-FF12.

The toggle T-FF of each stage outputs a signal having a delay time defined as $Pw \times 2^n$ (n is an integer equal to or greater than 1 representing the number of the stages of the toggle T-FFs) where Pw represents a pulse width of the clock CLK. In this example, the over-current instruction signal is extracted from a toggle T-FF5 at a fifth stage, and the over-discharge instruction signal indicating the detection of the over-discharge is extracted from a toggle T-FF9 at a ninth stage. The over-charge instruction signal is extracted from the toggle T-FF12 at the twelfth stage. Those signals are output to the logical operation circuit 25 described with reference to FIG. 1.

Figures 3, 4:
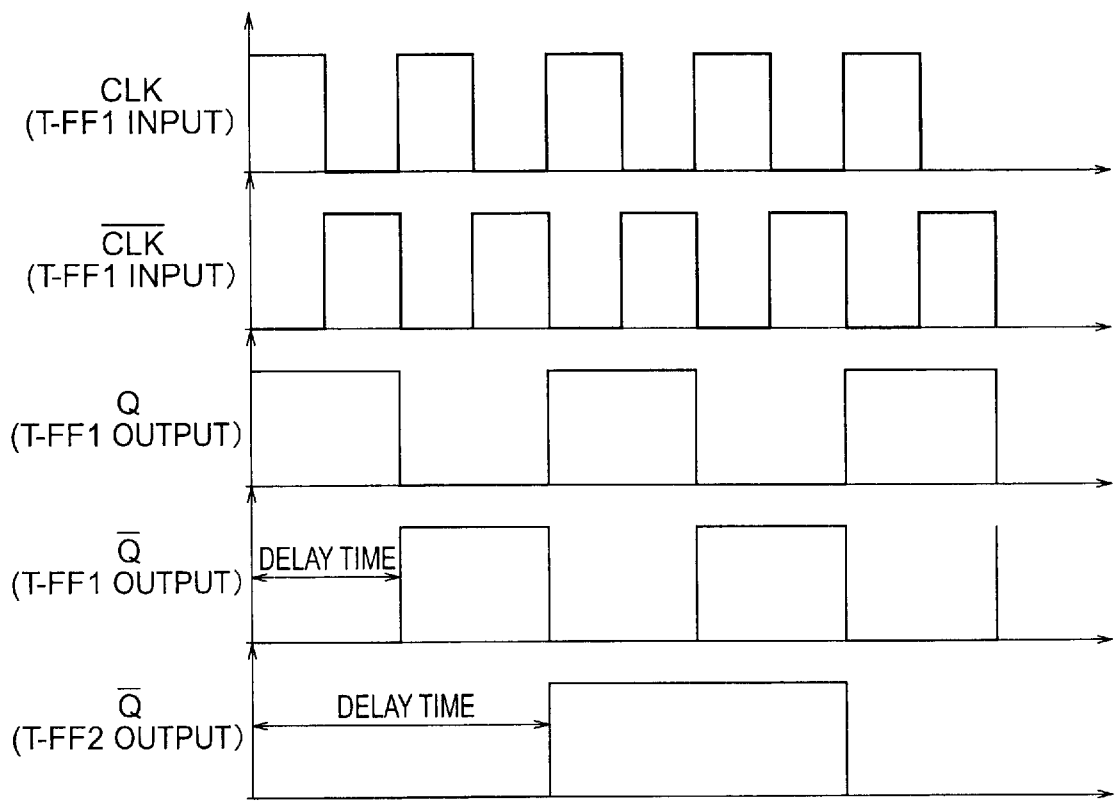
FIG. 3 shows input and output waveforms of flip-flops at first and second stages of a flip-flop circuit in FIG. 2.
FIG. 4 is a table showing relationships between outputs from the flip-flop circuit in FIG. 2 and various detected abnormal states.

FIG. 3 shows waveforms of a clock CLK (to the top of the input side of the toggle T-FF1 in FIG. 2) and a clock $\overline{CLK}$ (to the bottom of the input side of the toggle T-FF1 in FIG. 2) which are inputs to the toggle T-FF1 at the first stage of the circuit in FIG. 2 and an output Q (from the top of the output side of the toggle T-FF1 in FIG. 2) and an output $\overline{Q}$ (from the bottom of the output side of the toggle T-FF1 in FIG. 2) which are outputs from the toggle T-FF1 and an output $\overline{Q}$ from a toggle T-FF2 at a second stage.

FIG. 4 shows relationships between abnormal states of a secondary battery and outputs from the toggle T-FFs.

The pulse width Pw of the clock CLK is determined by N stages (N is an integer equal to or greater than 2) of charge/discharge sections 26-11, 26-12, 26-13, and 26-14 of the clock generation circuit 26-1. That is, N equals 4 in the present example. The charge/discharge sections 26-11 through 26-14 have identical configurations. Referring to the charge/discharge section 26-11 for example, it is comprised of an n-MOS transistor T11 for charging and discharging, a p-MOS current mirror transistor T12, and a capacitor C11.

Figure 5:
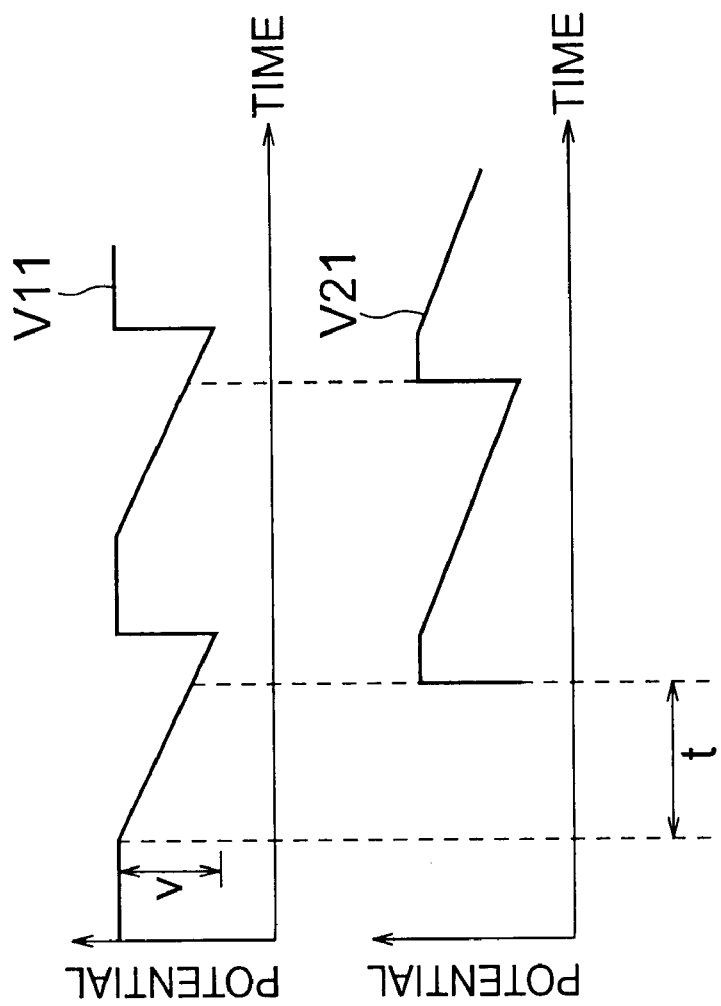
FIGS. 5A and 5B are waveforms showing operations of a charge/discharge section of a clock generation circuit in FIG. 2.

Referring also to FIGS. 5A and 5B, the capacitor C11 of the charge/discharge section 26-11 is charged and discharged in accordance with a voltage at the gate of the transistor T11. Specifically, the transistor T11 which has been on is turned off when the gate voltage rises to a threshold value to start charging of the capacitor C11 with a current I. A voltage V11 between the drain of the transistor T11 and the drain of the transistor T12 then decreases as shown in FIG. 5A. When the voltage V11 decreases to the threshold value, a transistor T21 for charging and discharging of the charge/discharge section 26-12 is turned on as shown in FIG. 5B to start charging of a capacitor C21 with the current I. When the charging of the capacitor C11 is completed, the voltage V11 returns to the initial value. The same operation is repeated in the charge/discharge sections 26-13 and 26-14.

Current mirror transistors T12, T22, T32, and T42 (first current mirror transistors) are provided to apply the same current I to the lines of capacitors C11, C21, C31, and C41, respectively.

The charge Q accumulated in the capacitor C11 during the above-described operation is expressed by:

$$Q = C \cdot V = I \cdot t$$

where C represents the capacity of the capacitor C11; V represents the voltage; I represents the charging current; and t represents time.

An equation $t=(C \cdot V)/I$ can be derived from the above equation, and the time t therefore determines the period of the clock CLK of the clock generation circuit 26-1.

In the conventional blind time setting circuit 26, the period of the clock CLK of the clock generation circuit 26-1 is fixed after it is once set as described above. If the period of the clock CLK fixed, the delay times of the over-current instruction signal, over-discharge instruction signal, and over-charge instruction signal output by the blind time setting circuit 26 are also fixed. In other words, the delay times of the various signals from the blind time setting circuit 26 can not be changed after the period of the clock CLK is once set. The reason is that the blind time setting circuit 26 is incorporated in the IC. As a result, the conventional secondary battery protection circuit has the following problems.

When the assembly of the secondary battery protection circuit is completed, a functional test is carried out on the same. For example, the function of the over-current detecting circuit is tested by repeatedly checking whether a protecting operation against the over-current properly takes place by applying an over-current actually. In this case, there is no need for the blind time, because the function of the over-current detecting circuit can be tested by only checking whether the protecting operation properly takes place against the over-current. However, since the blind time setting circuit also functions during the functional test, it is not possible to know whether the protecting operation properly takes place against the over-current unless the blind time set for the over-current passes. In addition, the above-described functional test must be carried out not only for the over-current but also for the over-charge and over-discharge. As a result, the secondary battery protection circuit as a whole has a waiting time attributable to the blind time that can not be ignored, which necessitates a long time to carry out the functional test.

Figure 6:
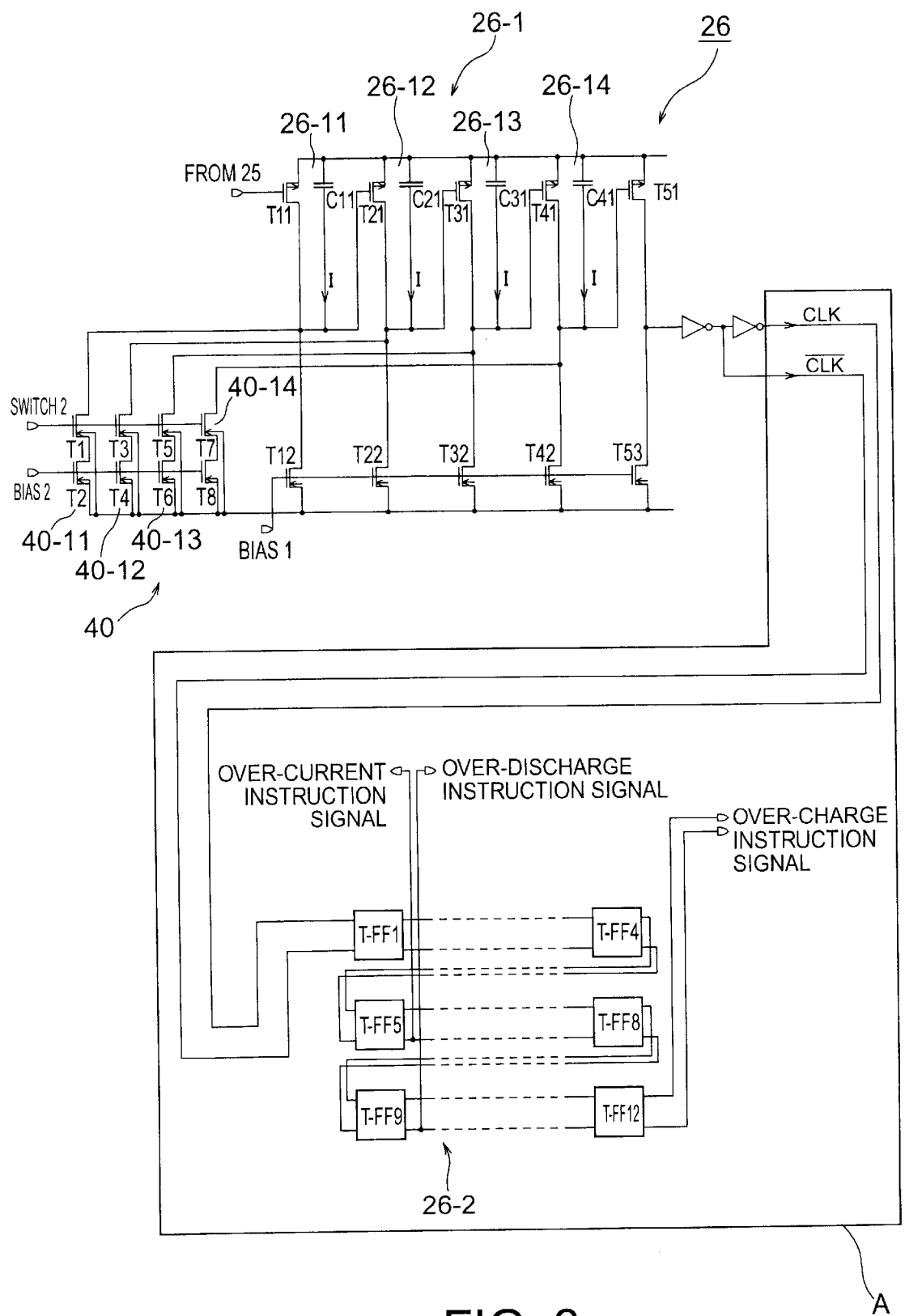
FIG. 6 is a circuit diagram showing a configuration of a major part of a blind time setting circuit according to an embodiment of the present invention.

A blind time setting circuit according to a preferred embodiment of the present invention will now be described with reference to FIGS. 6 and 7. The blind time setting circuit according to the present embodiment can be used in the secondary battery protection circuit described with reference to FIG. 1. In FIG. 6, parts identical to those in FIG. 2 are indicated by like reference numerals. Operations of a clock generation circuit 26-1 and an FF circuit 26-2 will not be described in detail because they are the same as those shown in FIG. 2.

In the blind time setting circuit according to the present embodiment, a switching circuit 40 for reducing a blind time is provided in a clock generation circuit 26-1 as shown in FIG. 2. The switching circuit 40 is constituted by current mirror circuits 40-11, 40-12, 40-13, and 40-14 that form four stages. The four stages of current mirror circuits 40-11 through 40-14 are respectively connected to lines of capacitors C11 through C41 of charge/discharge sections 26-11 through 26-14 that form four stages. Each of the current mirror circuits changes the period of a clock CLK from the clock generation circuit 26-1 by increasing a current I that flows through the line of the respective capacitor. The current mirror circuits 40-11 through 40-14 have identical configurations. Specifically, a pair of series-connected p-MOS current mirror transistors (second current mirror transistors) T1 and T2 are connected to the line of the capacitor C11 at the first stage as the current mirror circuit 40-11 at the first stage. A pair of series-connected current mirror transistors T3 and T4 (second current mirror transistors) are connected to the line of the capacitor C21 at the second stage as the current mirror circuit 40-12 at the second stage. A pair of series-connected current mirror transistors T5 and T6 (second current mirror transistors) are connected to the line of the capacitor C31 at the third stage as the current mirror circuit 40-13 at the third stage. A pair of series-connected current mirror transistors T7 and T8 (second current mirror transistors) are connected to the line of the capacitor C41 at the fourth stage as the current mirror circuit 40-14 at the fourth stage.

The gates of the transistors T1, T3, T5, and T7 of the respective current mirror circuits 40-11 through 40-14 are commonly connected to a time reduction terminal 71 (FIG. 7), and the gates of the transistors T2, T4, T6, and T8 are also commonly connected to the time reduction terminal 71. As a result, the transistors T1 through T8 are turned on when a voltage at the time reduction terminal 71 falls below the source voltage of the transistors T1 through T8. This is achieved by connecting the time reduction terminal 71 to the negative electrode, as will be described later.

When the current mirror circuits 40-11 through 40-14 are turned on, the current I at the charge/discharge sections 26-11 through 26-14 increases by the same amount. The increase in the current I results in a reduction of the period of the clock CLK from the clock generation circuit 26-1. The reason is that the period of the clock CLK from the clock generation circuit 26-1 is defined as "$t=(C \cdot V)/I$" as previously described and that there is an increase in the current I. The current I may be arbitrarily set. The period of the clock CLK can therefore be arbitrarily set, too. When the period of the clock CLK is reduced, the delay times of the over-current instruction signal, over-discharge instruction signal, and over-charge instruction signal output by the blind time setting circuit 26 are also reduced.

During various functional tests on the secondary battery protection circuits, the current mirror circuits 40-11 through 40-14 are operated to minimize the blind time of the blind time setting circuit 26. This makes it possible to minimize the waiting time required for testing operations, thereby allowing the time required for the entire functional tests to be significantly reduced.

Figure 7:
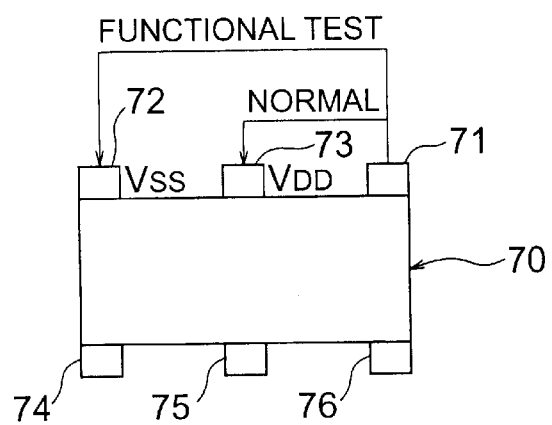
FIG. 7 is an illustration showing an arrangement of terminals of a secondary battery protection circuit including the blind time setting circuit according to the present invention incorporated in an IC.

FIG. 7 shows an IC package incorporating the secondary battery protection circuit including the blind time setting circuit. An IC package 70 has a $V_{SS}$ terminal 72, a $V_{DD}$ terminal 73, an output terminal 74, an input terminal 75, and an output terminal 76 in addition to the time reduction terminal 71. The current mirror circuits 40-11 through 40-14 can be activated by changing connections between predetermined terminals among the plurality of input and output terminals. The $V_{SS}$ terminal 72 is a ground terminal of the IC and is a connection terminal at a negative electrode of the secondary battery. The $V_{DD}$ terminal 73 is a power supply input terminal which is connected to the positive electrode of the secondary battery. The time reduction terminal 71 corresponds to the switch 2 shown in FIG. 6. The output terminal 74 is an output terminal for the discharge control signal (refer to FIG. 1). As will be later described, the input terminal 75 is a terminal that is connected to the negative terminal to be connected to a load or charger (not shown). The output terminal 76 is an output terminal for the charge control signal (refer to FIG. 1).

As described above, the current mirror circuits 40-11 through 40-14 can be provided by connecting the terminal of the switch 2 to the negative electrode. This can be achieved by only connecting the time reduction terminal 71 in FIG. 7 to the $V_{SS}$ terminal 72 during a functional test. The time reduction terminal 71 is otherwise connected to the $V_{DD}$ terminal 73.

Figure 8:
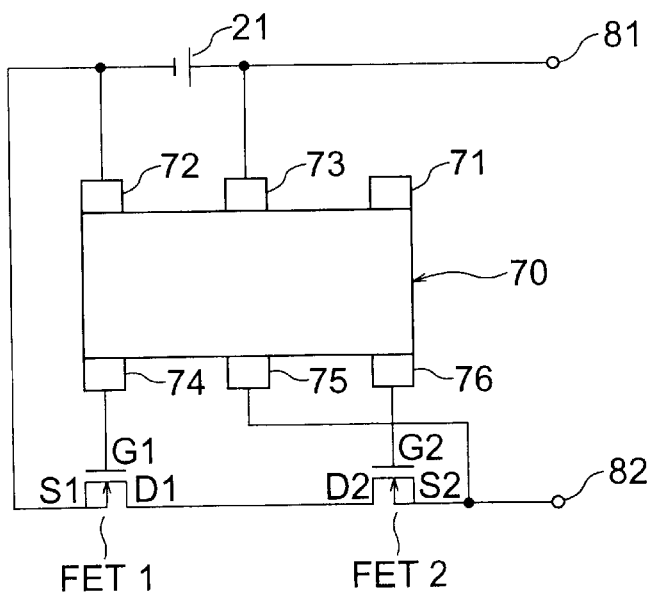
FIG. 8 is a circuit diagram showing an example of a secondary battery unit according to the present invention.

Referring to FIG. 8, the secondary battery unit according to the present invention will be described. The secondary battery unit has a positive terminal 81 and negative terminal 82. The positive and negative terminals 81 and 82 are also called external connection terminals. Between the positive and negative terminals 81 and 82, the load or the charger (not shown) is connected. The $V_{DD}$ terminal 73 and the positive terminal 81 are connected to the positive electrode of the secondary battery 21. Between the negative electrode of the secondary battery 21 and the negative terminal 82, first and second field effect transistors FET1 and FET2 are connected in series with each other. The first field effect transistor FET1 is operable as a discharge control switch while the second field effect transistor FET2 is operable as a charge control switch. In the example being illustrated, each of the first and the second field effect transistors FET1 and FET2 consists of an n-channel metal oxide semiconductor field effect transistor (MOSFET). The first field effect transistor FET1 has a first source S1 connected to the negative electrode of the secondary battery 21, a first gate G1 connected to the output terminal 74, and a first drain D1. The second field effect transistor FET2 has a second source S2 connected to the negative terminal 82, a second gate G2 connected to the output terminal 76, and a second drain D2 connected to the first drain D1 of the first field effect transistor FET1. An arrangement of the first and second field effect transistors FET1 and FET2 may be exchanged. The input terminal 75 is connected to the negative terminal 82.

The first field effect transistor FET1 is normally turned on. The first field effect transistor FET1 is turned off when the first gate G1 is supplied with the discharge control signal having a logic low level from the logical operation circuit 25. On the other hand, the second field effect transistor FET2 is also normally turned on. The second field effect transistor FET2 is turned off when the second gate G2 is supplied with the charge control signal having a logic low level from the logical operation circuit 25.

While the present invention has been described with reference to a preferred embodiment of the same, the present invention is not limited by the above-described embodiment. For example, the MOS transistors in the circuit of FIG. 6 may be either of p-MOS and n-MOS transistors.

What is claimed is:

1. A secondary battery protection circuit which detects at least one of an over-discharge state, an over-charge state, and an over-current state of a secondary battery to perform an operation in accordance with the detected state and which has a blind time setting circuit constituted by an IC for setting a blind time in accordance with the detected state, wherein the blind time setting circuit comprises a switching circuit for setting a blind time for a functional test that is shorter than a preset blind time.

2. A secondary battery protection circuit according to claim 1, wherein the blind time setting circuit includes a clock generation circuit for generating clocks and n (n is an integer equal to or greater than 1) stages of flip-flop circuits for dividing the clocks;

the period of the clock is determined by a current I that flows through the clock generation circuit; and the switching circuit includes a current mirror circuit connected to the clock generation circuit for controlling the current I.

3. A secondary battery protection circuit according to claim 2, wherein the blind time setting circuit is constituted by an IC;

the IC has a plurality of input and output terminals; and the current mirror circuit is activated by changing connections between predetermined terminals among the plurality of input and output terminals.

4. A secondary battery protection circuit according to claim 3, wherein the clock generation circuit includes N (N is an integer equal to or greater than 2) stages of charge/discharge sections each including a transistor for charging and discharging, a capacitor connected in parallel to the transistor, and a first current mirror transistor connected in series to the transistor for charging and discharging; and the current mirror circuit includes N stages of second current mirror transistors which are connected to lines of the capacitors at the N respective stages to increase the current I flowing through the lines, thereby reducing the period of the clock.

5. A secondary battery protection circuit according to claim 4, wherein the secondary battery is a lithium ion battery.

6. A secondary battery unit provided with the secondary battery protection circuit claimed in claim 1.

* * * * *